(12) United States Patent
Yu

(10) Patent No.: US 11,171,300 B2
(45) Date of Patent: Nov. 9, 2021

(54) QUANTUM DOT LIGHT EMITTING DIODE, METHOD FOR FABRICATING THE SAME, AND DISPLAY DEVICE

(71) Applicant: BOE TECHNOLOGY GROUP CO., LTD., Beijing (CN)

(72) Inventor: Gang Yu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 76 days.

(21) Appl. No.: 16/608,077

(22) PCT Filed: Apr. 8, 2019

(86) PCT No.: PCT/CN2019/081701
§ 371 (c)(1),
(2) Date: Oct. 24, 2019

(87) PCT Pub. No.: WO2019/196778
PCT Pub. Date: Oct. 17, 2019

(65) Prior Publication Data
US 2020/0075877 A1 Mar. 5, 2020

(30) Foreign Application Priority Data
Apr. 12, 2018 (CN) .......................... 201810327830.3

(51) Int. Cl.
*H01L 51/50* (2006.01)
(52) U.S. Cl.
CPC ........ *H01L 51/502* (2013.01); *H01L 51/5056* (2013.01); *H01L 51/5072* (2013.01); *H01L 51/5092* (2013.01)
(58) Field of Classification Search
CPC ............... H01L 51/502; H01L 51/5056; H01L 51/5072; H01L 51/5092; H01L 51/0061; H01L 27/3209
See application file for complete search history.

(56) References Cited

U.S. PATENT DOCUMENTS 6,831,406 B1 * 12/2004 Fukuyama .......... H01L 51/5012
313/503
8,072,135 B2 * 12/2011 Kashiwabara ...... H01L 51/5036
313/504
(Continued)

FOREIGN PATENT DOCUMENTS

| CN | 102925138 A | 2/2013 |
| CN | 104371730 A | 2/2015 |

(Continued)

OTHER PUBLICATIONS

International Search Report received for PCT Patent Application No. PCT/CN2019/081701, dated Jul. 12, 2019, 5 pages (2 pages of English Translation and 3 pages of Original Document).
(Continued)

*Primary Examiner* — Bac H Au
(74) *Attorney, Agent, or Firm* — Womble Bond Dickinson (US) LLP

(57) ABSTRACT

A quantum dot light emitting diode includes: a light emitting layer, the light emitting layer including a first quantum dot layer and a second quantum dot layer which are stacked; the first quantum dot layer including a first quantum dot having a hole transporting property; and the second quantum dot layer including a second quantum dot having an electron transporting property. The first quantum dot layer having hole transporting property and the second quantum dot layer having electron transporting property are stacked. The first quantum dot layer and the second quantum dot layer not only form a quantum dot light emitting layer, but also transport holes and electrons respectively, thereby causing excitons to be recombined in the first quantum dot layer and/or the second quantum dot layer, or near the interface of the first quantum dot layer and the second quantum dot layer.

18 Claims, 3 Drawing Sheets

(56) References Cited

U.S. PATENT DOCUMENTS

| | | | |
|---|---|---|---|
| 8,710,495 B2* | 4/2014 | Seo | H01L 51/5036 257/40 |
| 9,773,943 B1 | 9/2017 | Xie | |
| 2004/0185300 A1* | 9/2004 | Hatwar | C09K 11/06 428/690 |
| 2008/0231177 A1* | 9/2008 | Nomura | H01L 51/5016 313/504 |
| 2012/0032141 A1 | 2/2012 | Tsai et al. | |
| 2016/0233449 A1* | 8/2016 | Murayama | C09K 11/883 |
| 2016/0322583 A1* | 11/2016 | Kim | H01L 51/0054 |
| 2017/0174984 A1 | 6/2017 | Lee et al. | |
| 2018/0215695 A1 | 8/2018 | Zhuo | |
| 2019/0153313 A1* | 5/2019 | Luchinger | C09K 11/664 |
| 2019/0214604 A1* | 7/2019 | Zhen | H01L 21/02296 |
| 2019/0305240 A1* | 10/2019 | Angioni | H01L 51/5092 |
| 2020/0075877 A1 | 3/2020 | Yu | |

FOREIGN PATENT DOCUMENTS

| | | |
|---|---|---|
| CN | 105185918 A | 12/2015 |
| CN | 105684555 A | 6/2016 |
| CN | 106083573 A | 11/2016 |
| CN | 106816539 A | 6/2017 |
| CN | 106893136 A | 6/2017 |
| CN | 108550707 A | 9/2018 |
| JP | 2005-228899 A | 8/2005 |
| JP | 2005-268573 A | 9/2005 |

OTHER PUBLICATIONS

Office Action received for Chinese Patent Application No. 201810327830.3, dated May 14, 2021, 16 pages (8 pages of English Translation and 8 pages of Office Action).

* cited by examiner

QUANTUM DOT LIGHT EMITTING DIODE, METHOD FOR FABRICATING THE SAME, AND DISPLAY DEVICE

RELATED APPLICATION

The present application is a 35 U.S.C. 371 national stage application of PCT International Application No. PCT/CN2019/081701, filed on Apr. 8, 2019, which claims the benefit of the Chinese Patent Application No. 201810327830.3, filed on Apr. 12, 2018, the entire disclosure of which is incorporated herein by reference.

TECHNICAL FIELD

The present disclosure relates to the field of displays, and in particular to a quantum dot light emitting diode (QLED), a method for fabricating the same, and a display device.

BACKGROUND

QLEDs are used in display devices based on their high color gamut. Typically, a QLED includes: a hole injection layer, a hole transporting layer, a quantum dot light emitting layer, and an electron transporting layer, which are sequentially stacked. Under the action of an electric field, holes and electrons perform migration of the carriers in their respective transport layers, and combine into excitons in the quantum dot light emitting layer to emit light.

In the related art, the hole injection layer and the hole transporting layer mostly use an organic material having a hole transporting property, such as triarylamines; and the electron transporting layer mostly uses a metal oxide semiconductor material having a high electron mobility, such as ZnO nanoparticles.

SUMMARY

The embodiments of the present disclosure provide a QLED, a method for fabricating the same, and a display device.

According to an aspect of the present disclose, a quantum dot light emitting diode is provided. The quantum dot light emitting diode includes: a light emitting layer, the light emitting layer including a first quantum dot layer and a second quantum dot layer which are stacked; the first quantum dot layer includes a first quantum dot having a hole transporting property; and the second quantum dot layer includes a second quantum dot having an electron transporting property.

In a possible implementation, a surface of the first quantum dot is coordinated with a hole transporting ligand; the hole transporting ligand includes: a ligand alkyl chain and a hole transporting group bonded to an alkyl group of the ligand alkyl chain; and the ligand in the ligand alkyl chain includes at least one of a mercapto group, a polymercapto group, an amino group, a polyamino group, and a phosphorusoxy group.

In a possible implementation, the hole transporting group includes at least one of triphenylamine, carbazole, and thiophene.

In a possible implementation, the first quantum dot is prepared by the following method: bonding the hole transporting group to a ligand alkyl chain to form the hole transporting ligand; and chemically substituting the hole transporting ligand with a quantum dot which has a surface coordinated with oleic acid, trioctylphosphine or oleylamine ligand, to obtain the first quantum dot which has the surface coordinated with the hole transporting ligand.

In a possible implementation, a surface of the second quantum dot is coordinated with an electron transporting ligand; the electron transporting ligand includes: a ligand alkyl chain and an electron transporting group bonded to an alkyl group of the ligand alkyl chain; and the ligand in the ligand alkyl chain includes at least one of a mercapto group, a polymercapto group, an amino group, a polyamino group, and a phosphorusoxy group.

In a possible implementation, the electron transporting group includes at least one of a pyridine, a diazine, a cyano group, and a boron-containing aromatic group.

In a possible implementation, the second quantum dot is prepared by the following method: bonding the electron transporting group to a ligand alkyl chain to form the electron transporting ligand; and chemically substituting the electron transporting ligand with a quantum dot which has a surface coordinated with oleic acid, trioctylphosphine or oleylamine ligand, to obtain the second quantum dot which has the surface coordinated with the electron transporting ligand.

In a possible implementation, the first quantum dot is oil-soluble, and the second quantum dot is water-soluble; alternatively, the first quantum dot is water-soluble, and the second quantum dot is oil-soluble.

In a possible implementation, one of the first quantum dot or the second quantum dot includes a crosslinked structure.

In a possible implementation, the quantum dot light emitting diode further includes: a hole transporting layer and a hole injection layer on a side of the first quantum dot layer facing away from the second quantum dot layer; and an electron transporting layer on a side of the second quantum dot layer facing away from the first quantum dot layer.

In a possible implementation, the quantum dot light emitting diode further includes: a hole injecting layer on a side of the first quantum dot layer facing away from the second quantum dot layer.

In a possible implementation, the quantum dot light emitting diode further includes one of: a hole transporting layer between the hole injection layer and the first quantum dot layer; and an electron transporting layer formed on a side of the second quantum dot layer facing away from the first quantum dot layer.

According to another aspect of the present disclose, a display device including any one of the quantum dot light emitting diodes described above is provided.

In a possible implementation, the display device further includes: a liquid crystal display panel; wherein a light emitting surface of the quantum dot light emitting diode faces a light incident surface of the liquid crystal display panel.

In a possible implementation, the display device further includes: an array substrate; wherein the quantum dot light emitting diode is on the array substrate.

According to an aspect of the present disclose, a method for fabricating a quantum dot light emitting diode is provided. The method includes: providing a first quantum dot layer; providing a second quantum dot layer; and stacking the first quantum dot layer and the second quantum dot layer to form a light emitting layer; wherein the first quantum dot layer including a first quantum dot having a hole transporting property; and the second quantum dot layer including a second quantum dot having an electron transporting property.

In a possible implementation, the step of providing the first quantum dot layer includes: bonding a hole transporting group to a ligand alkyl chain to form a hole transporting ligand; and chemically substituting the hole transporting ligand with a quantum dot which has a surface coordinated with oleic acid, trioctylphosphine or oleylamine ligand to obtain a first quantum dot which has a surface coordinated with a hole transporting ligand.

In a possible implementation, a surface of the first quantum dot is coordinated with a hole transporting ligand; the hole transporting ligand includes: a ligand alkyl chain and a hole transporting group bonded to an alkyl group of the ligand alkyl chain; the ligand in the ligand alkyl chain includes at least one of a mercapto group, a polymercapto group, an amino group, a polyamino group, and a phosphorusoxy group.

In a possible implementation, the step of providing the second quantum dot layer includes: bonding an electron transporting group to a ligand alkyl chain to form an electron transporting ligand; and chemically substituting the electron transporting ligand with a quantum dot which has a surface coordinated with oleic acid, trioctylphosphine or oleylamine ligand to obtain a second quantum dot which has a surface coordinated with an electron transporting ligand.

In a possible implementation, a surface of a second quantum dot is coordinated with an electron transporting ligand; the electron transporting ligand includes: a ligand alkyl chain and an electron transporting group bonded to an alkyl group of the ligand alkyl chain; the ligand in the ligand alkyl chain includes at least one of a mercapto group, a polymercapto group, an amino group, a polyamino group, and a phosphorusoxy group.

BRIEF DESCRIPTION OF THE DRAWINGS

In order to more clearly illustrate the technical solutions in embodiments of the disclosure, the appended drawings needed to be used in the description of the embodiments will be briefly introduced below. Obviously, the drawings in the following description are only some embodiments of the disclosure, and for those of skilled in the art, other drawings may be obtained according to these drawings without creative work.

DETAILED DESCRIPTION OF THE DISCLOSURE

Figure 1:
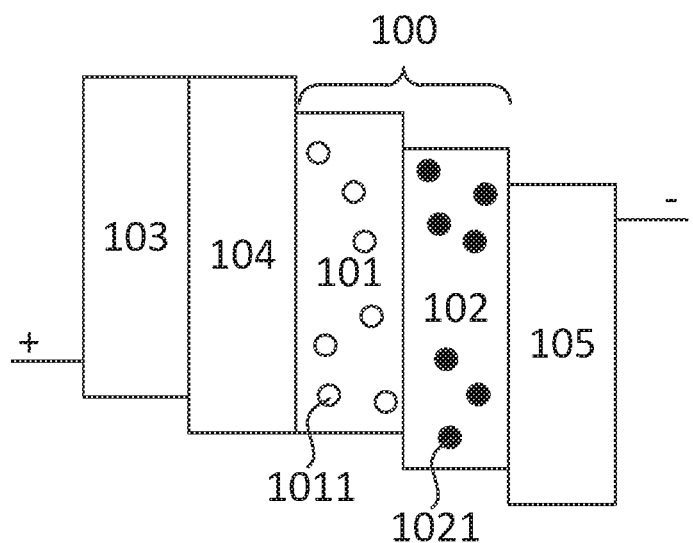
FIG. 1 is a structural schematic diagram of a QLED according to an embodiment of the present disclosure.

In the following, the technical solutions in the embodiments of the disclosure will be clearly and completely described in connection with the drawings in the embodiments of the disclosure. Obviously, the described embodiments are only part of the embodiments of the disclosure, rather than all embodiments. Based on the embodiments in the disclosure, all other embodiments obtained by those of skilled in the art without creative efforts are all within the protection scope of the disclosure.

In the QLED of the related art, the hole injection layer and the hole transporting layer mostly use an organic material having a hole transporting property, such as triarylamines; and the electron transporting layer mostly uses a metal oxide semiconductor material having a high electron mobility, such as ZnO nanoparticles. The hole transporting material has a low hole mobility with respect to an electron mobility of the electron transporting material, and the exciton recombination region is generally formed in the hole transporting layer, not in the desired quantum dot light emitting layer.

Embodiments of the present disclosure provide a QLED. As shown in FIGS. 1-4, the QLED includes: a light emitting layer 100. The light emitting layer 100 includes a first quantum dot layer 101 and a second quantum dot layer 102, which are stacked.

The first quantum dot layer 101 includes a first quantum dot 1011 having hole transporting property.

The second quantum dot layer 102 includes a second quantum dot 1021 having electron transporting property.

In the QLED provided by the embodiment of the present disclosure, a first quantum dot layer having hole transporting property and a second quantum dot layer having electron transporting property are stacked. The first quantum dot layer and the second quantum dot layer not only form a quantum dot light emitting layer, but also transport holes and electrons respectively, thereby causing excitons to be recombined in the first quantum dot layer and/or the second quantum dot layer, or near the interface of the first quantum dot layer and the second quantum dot layer. Thereby, the exciton recombination region is ensured in the quantum dot light emitting layer, and the luminous efficiency of the QLED is improved.

As described above, the first quantum dot has the hole transporting property, and the second quantum dot has the electron transporting property, and the structures of these quantum dots are summarized respectively below.

In a possible implementation, a surface of the first quantum dot is coordinated with a hole transporting ligand. The hole transporting ligand includes: a ligand alkyl chain and a hole transporting group bonded to an alkyl group of the ligand alkyl chain. The ligand in the ligand alkyl chain includes at least one of a mercapto group, a polymercapto group, an amino group, a polyamino group, and a phosphorusoxy group.

The hole transporting property of the first quantum dot is imparted by using a group having hole transporting property, so that holes may migrate in the formed first quantum dot layer. The hole transporting group and the alkyl group of the ligand alkyl chain may be effectively bonded. The ligand may coordinate with the quantum dot to achieve efficient bonding of the hole transporting group to the quantum dot.

In the embodiments of the present disclosure, the alkyl group involved in the mercaptoalkyl group may be an alkyl group having 2 to 20 carbons, such as an ethyl group, a propyl group, a butyl group or the like. The ligand in the ligand alkyl chain is selected from a mercapto group, a polymercapto group, an amino group, a polyamino group or a phosphorusoxy group. For example, the ligand alkyl chain may be a mercaptoalkyl chain, a polydecylalkyl chain, an aminoalkyl chain, a polyaminoalkyl chain, a phosphorusoxyalkyl chain, and the like.

Optionally, the hole transporting group includes at least one of triphenylamine, carbazole, and thiophene.

For example, when the ligand alkyl chain is a mercaptoalkyl chain and the hole transporting group is triphenylamine. The chemical structure formula (1-1) of the formed hole transporting ligand is:

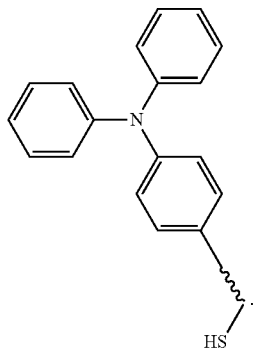

(1-1)

The hole transporting group may be a carbazole. The chemical structure formula (1-2) of the formed hole transporting ligand is:

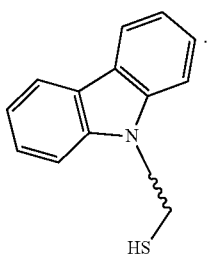

(1-2)

Based on this, a benzene ring may also be bonded between the mercaptoalkyl chain and the carbazolyl group to adjust the carrier mobility property of the ligand, the stacked form between the ligands, and the like. The chemical structural formula (1-3) of the formed hole transporting ligand is:

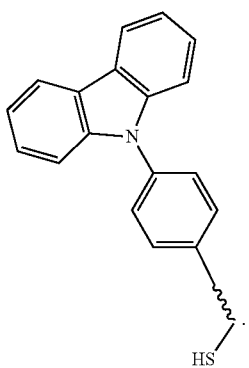

(1-3)

Further, in order to form a crosslinkable hole transporting ligand, more than one, for example, two or more mercaptoalkyl groups may be bonded to the hole transporting group. Take a carbazolyl group as an example, two mercaptoalkyl groups may be bonded thereto, and the chemical structure formula (1-4) of the formed hole transporting ligand is:

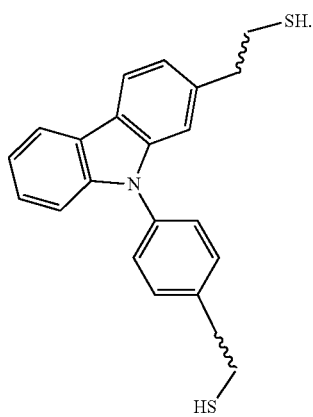

(1-4)

As described above, the hole transporting group can not only be bonded to the mercaptoalkyl group separately, but also be combined with each other to be bonded to the mercaptoalkyl group. For example, when a combination of a thiophene group and a triphenylamine group is employed. The chemical structure formula (1-5) of the hole transporting ligand that can be formed is:

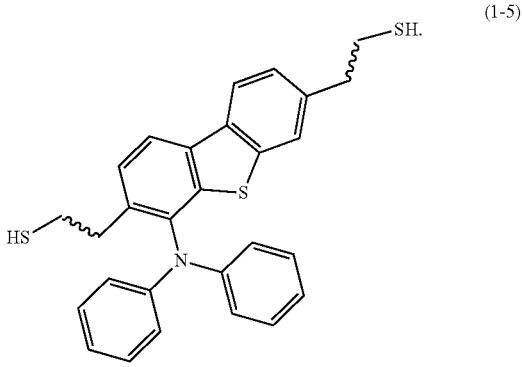 [SMILES: SCCc1ccc2c(c1)sc1c(N(c3ccccc3)c3ccccc3)c(CCS)ccc12]

(1-5)

Further, it is known from the above chemical formula that, the hole transporting ligand further employs a plurality of mercapto groups, so that it has the property as a bridge chain.

It should be noted that, in the chemical structural formula of the present disclosure, since the carbon number of the alkyl group is uncertain, the alkyl group in the above mercaptoalkyl chain is represented by a wavy line.

Taking the difference in structure between the first quantum dot and the conventional quantum dot into account, the preparation method of the first quantum dot is summarized below.

In a possible implementation, the first quantum dot is prepared by the following method: bonding a hole transporting group to a ligand alkyl chain to form a hole transporting ligand; and chemically substituting the hole transporting ligand with a quantum dot which has a surface coordinated with oleic acid, trioctylphosphine or oleylamine ligand, to obtain a first quantum dot which has a surface coordinated with a hole transporting ligand.

For the preparation of hole transporting ligands, they may be formed by simply chemical grafting. Subsequently, by a chemical substitution reaction, the hole transporting ligand is substituted with a common quantum dot which has a surface coordinated with oleic acid, trioctylphosphine or oleylamine ligand, so that the hole transporting ligand replaces oleic acid, a trioctylphosphine or oleylamine ligand. In this way, a ligand in the ligand alkyl chain, such as a mercapto group, coordinates with a quantum dot, thereby coordinating the surface of the formed first quantum dot with a hole transporting ligand.

It can be understood that the above-mentioned "quantum dot which has a surface coordinated with oleic acid, trioctylphosphine or oleylamine ligand" is a quantum dot commonly used in the art, such as a core-shell structured CdSe/ZnS quantum dot, and embodiments of the present disclosure are not specifically limited herein.

For example, when a hole transporting ligand represented by the chemical structure formula (1-5) and CdSe/ZnS quantum dot having oleic acid as a ligand are used, by chemical substitution, the first quantum dot indicated with the chemical structural formula (1-6) may be formed:

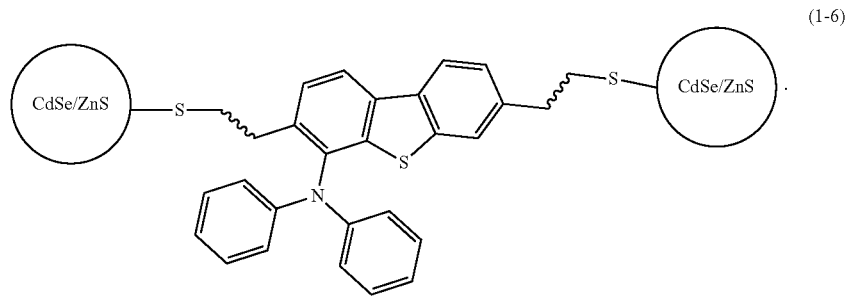

(1-6)

Specifically, the first quantum dot described above may be obtained by the following operation steps: taking an octane solution of a CdSe/ZnS quantum dot which uses oleic acid as a ligand; adding a toluene solution containing the hole transporting ligand represented by the chemical structure formula (1-5) at a predetermined molar ratio; and stirring and well mixing the two solutions at room temperature (for example, 22-25° C.).

Then, the mixture is centrifuged at 10,000-20,000 rpm, and the precipitate is washed with ethyl acetate to remove the substituted oleic acid ligand. Centrifuge again to obtain a precipitate, which is the first quantum dot. And then, a first quantum dot is dissolved in toluene to obtain a solution of the first quantum dot for storage.

For the second quantum dot, it is similar in structure and formation method to the first quantum dot. The involved ligand alkyl chain, quantum dot which has a surface coordinated with oleic acid, trioctylphosphine or oleylamine ligand and the like may all be the same as those involved in the first quantum dot. The only difference is that it has an electron transporting group and not a hole transporting group.

In a possible implementation, a surface of the second quantum dot is coordinated with an electron transporting ligand. The electron transporting ligand includes: a ligand alkyl chain and electron transporting group bonded to an alkyl group of the ligand alkyl chain. The ligand in the ligand alkyl chain includes at least one of a mercapto group, a polymercapto group, an amino group, a polyamino group, and a phosphorusoxy group.

The electron transporting property of the second quantum dot is imparted by using a group having an electron transporting property, and an effective bonding of the electron transporting group and the quantum dot is achieved by using a ligand alkyl chain.

Exemplarily, the electron transporting group includes at least one of pyridine, diazine, cyano group, and boron-containing aromatic group.

For example, the electron transporting group may be pyridine. The chemical structural formula (2-1) of the formed electron transporting ligand is:

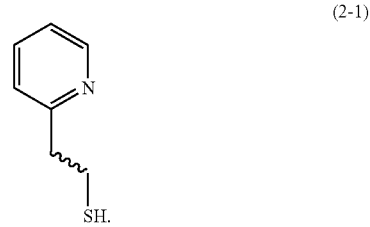

(2-1)

The electron transporting group may be a diazine. The chemical structural formula (2-2) of the formed electron transporting ligand is:

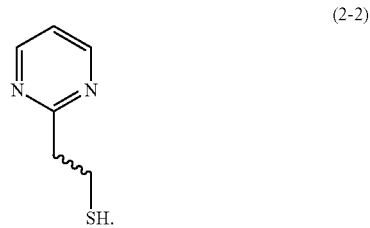

(2-2)

Further, other groups such as a benzene ring or a carboxyl group may be bonded to the electron transporting group. Take the chemical structural formula shown by (2-2) as an example, after the benzene ring is bonded, the chemical structural formula (2-3) of the formed electron transporting ligand is:

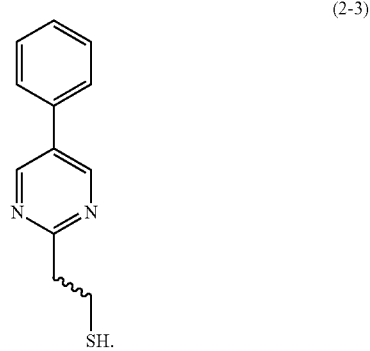 [SMILES: SCCc1ncc(-c2ccccc2)cn1]

(2-3)

The electron transporting group with the chemical structural formula (2-3) has a function of adjusting the ligand energy level and changing the form of the ligand stack by adding the benzene ring.

Take the chemical structural formula shown by (2-1) as an example, a carboxyl group is bonded to a pyridyl group. The chemical structural formula (2-4) of the formed electron transporting ligand is:

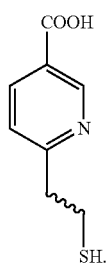

(2-4)

The electron transporting group with the chemical structural formula (2-4) has a function of adjusting the hydrophilicity and hydrophobicity of the ligand and thus the hydrophilicity and hydrophobicity of the whole quantum dot by adding the carboxyl group.

It may be seen from the above that the electron transporting group may also employ a combination of pyridine, diazine, and cyano group. For example, when using a diazine and a cyano group at the same time with a benzene ring being bonded in-between, the chemical structural formula (2-5) of the formed electron transporting ligand is:

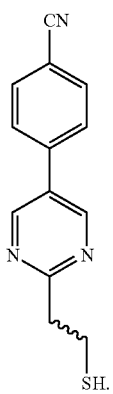

(2-5)

Taking the difference in structure between the second quantum dot and the conventional quantum dot into account, the preparation method of the second quantum dot is summarized below.

In a possible implementation, the second quantum dot is prepared by the following method: bonding an electron transporting group to a ligand alkyl chain to form an electron transporting ligand; and chemically substituting the electron transporting ligand with a quantum dot which has a surface coordinated with oleic acid, trioctylphosphine or oleylamine ligand, to obtain the second quantum dot which has the surface coordinated with the electron transporting ligand.

For example, when an electron transporting ligand represented by the chemical structural formula (2-5) and CdSe/ZnS quantum dot having oleic acid as a ligand are used, by chemical substitution, the second quantum dot indicated with the chemical structural formula (2-6) may be formed:

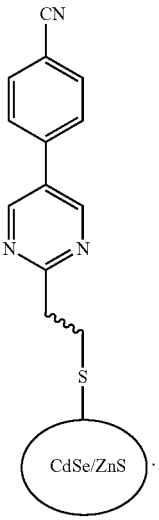

(2-6)

Specifically, the second quantum dot may be prepared by the following steps: taking an octane solution of CdSe/ZnS quantum dot which use oleic acid as a ligand; adding a toluene solution containing the electron transporting ligand represented by the chemical structural formula (2-5) at a predetermined molar ratio; and stirring and well mixing the two solutions at room temperature (for example, 22-25° C.).

Then, centrifuge at 10,000-20,000 rpm. Stir and well mix the two solutions at room temperature (for example, 22-25° C.), to remove the substituted oleic acid ligand. Centrifuge again to obtain a precipitate, which is the second quantum dot. And then, dissolve the second quantum dot in toluene to obtain a solution of the second quantum dot for storage.

In order to prevent the first quantum dot and the second quantum dot from being partially compatible when bonded, which influences the performance of each other. In the embodiment of the present disclosure, the first quantum dot is oil-soluble and the second quantum dot is water-soluble; alternatively, the first quantum dot is water-soluble and the second quantum dot is oil-soluble.

By setting the first quantum dot and the second quantum dot to be water-soluble and oil-soluble (or oil-soluble and water-soluble) respectively, when these quantum dots are stacked, the quantum dot layer formed later does not destroy the quantum dot layer formed previously, which ensures that after formation these quantum dot layers will not influence each other and will function normally.

For example, oil solubility may be imparted to a hole transporting ligand of the first quantum dot by introducing an oil-soluble group such as a long-chain alkyl group, a phenyl group or the like. At the same time, water solubility may be imparted to an electron transporting ligand of the second quantum dot by introducing a water-soluble group such as a carboxyl group, an amino group, a hydroxyl group or the like.

Optionally, one of the first quantum dot or the second quantum dot includes a crosslinked structure. For example, the first quantum dot ligand may achieve crosslink by conditions such as light/heat and is not easily destroyed by the solvent system of the second quantum dot. It may be understood that the quantum dot involved in the previously formed quantum dot layer may be made into a crosslinked structure to ensure the stability of the previously formed quantum dot layer structure. Thus, when the subsequent quantum dot layer is formed, the quantum dot layer formed previously will not be destroyed.

For example, when the first quantum dot is a crosslinked structure, two or more crosslinkable groups such as mercapto groups, carbon-carbon double bonds, epoxy groups, cyclopropane groups may be introduced to the hole transporting ligand of the first quantum dot, to make the first quantum dot crosslinkable. Also, the crosslinking process may be carried out by photo curing or heat curing.

The structure and preparation method of the first quantum dot and the second quantum dot are summarized above. When the quantum dot layer is formed by using the structure and preparation method of the first quantum dot and the second quantum dot respectively, the following method may be used.

For a previously formed quantum dot layer, such as a first quantum dot layer, a chemical solution deposition method may be used to deposit a raw material liquid containing a first quantum dot on a bottom layer (for example, a hole transporting layer or a hole injection layer), and a first quantum dot layer of a suitable specification is formed by printing, spin coating or the like.

In particular, the first quantum dot may be crosslinkable, and the first quantum dot layer may be cured into a film by photo curing or heat curing.

It may be understood that when the first quantum dot is deposited, the raw material liquid containing the first quantum dot may be formed by the following formula.

Take an octane solution of a CdSe/ZnS or InP/ZnSe/ZnS or other types of quantum dots which contains oleic acid as a ligand, add a toluene solution containing a hole transporting ligand represented by the chemical structural formula (1-5) at a predetermined molar ratio. Stir and well mix the two solutions at room temperature (for example, 22-25° C.).

Then, the mixture is centrifuged at 10,000-20,000 rpm, and the precipitate is washed with ethyl acetate to remove the substituted oleic acid ligand. Centrifuge again to obtain a precipitate, which is the first quantum dot. And then, a first quantum dot is dissolved in toluene to obtain a solution of the first quantum dot for storage. If there is a higher requirement for purity, after centrifugation again, it may be washed with ethyl acetate, and after centrifugation, the first quantum dot solution is dissolved in toluene, which may be used as a raw material liquid containing the first quantum dot.

Similarly, for the second quantum dot layer, the same method as the first quantum dot layer may be used, and in case it is used as a quantum dot layer formed later, if the first quantum dot layer is a crosslinked structure, the second quantum dot layer may be either a crosslinked or a non-crosslinked structure.

The structure of the QLED provided by the embodiment of the present disclosure is also changed correspondingly based on the use of the first quantum dot layer and the second quantum dot layer. The various structures of the QLED are separately summarized below.

As an example, as shown in FIG. 1, the QLED further includes: a hole transporting layer and a hole injection layer which are sequentially formed on one side of the first quantum dot layer; and an electron transporting layer formed on one side of the second quantum dot layer.

That is, as shown in FIG. 1, the QLED includes a hole injection layer 103, a hole transporting layer 104, a first quantum dot layer 101, a second quantum dot layer 102, and an electron transporting layer 105, which are sequentially stacked.

When applied, holes undergo carrier migration in the hole transporting layer and the first quantum dot layer, and electrons undergo carrier migration in the electron transporting layer and the second quantum dot layer, both of which are recombined into excitons in the first quantum dot layer and/or the second quantum dot layer to emit light, ensuring that the exciton recombination region is confined within the quantum dot layer.

The QLEDs of above-mentioned structure are generally applied to the following case: the light-emitting recombination region is easily to occur at the hole transporting layer, at the junction of the hole transporting layer and the quantum dot layer, at the electron transporting layer or at the junction of the electron transporting layer and the quantum dot layer. That is, the structure shown in FIG. 1 may be used for the structure of the QLED in which the above case may occur.

In the preparation of the QLED of the above structure, firstly, a hole injection layer preparation raw material, for example, a hole injecting organic or inorganic semiconductor, such as PEDOT:PSS or CuSCN (copper thiocyanate) solution, is deposited on the anode by a chemical solution deposition method. An ITO substrate may be used as the anode.

Next, a hole transporting layer preparation raw material, for example, a hole transporting type material such as TFB (poly(9,9-dioctylfluorene-CO—N-(4-butylphenyl) diphenylamine)), PVK (Polyvinylcarbazole), is deposited on the hole injection layer by a chemical solution deposition method.

Then, a first quantum dot layer is deposited and formed on the hole injection layer.

Subsequently, a second quantum dot layer is deposited and formed on the first quantum dot layer.

Subsequently, the electron transporting layer material, for example, inorganic nanoparticles such as ZnO, ZnMgO, ZnAlO or electron transporting organic small molecules such as TPBi (1,3,5-tris(1-benzene-1H-benzimidazol-2-yl) benzene), is formed on the second quantum dot layer by chemical solution deposition or evaporation.

Subsequently, a cathode layer which has a matched work function is formed on the second quantum dot layer by vacuum evaporation. For example, the raw material used for the cathode layer may be metal aluminum, magnesium or the like. It is to be understood that, not limited to the above, a transparent cathode such as ITO, IZO or the like may be deposited by sputtering.

It will be understood by those skilled in the art that the hole injection layer, the hole transporting layer, the electron transporting layer and the method for fabricating the same described above are all common in the art, and the embodiments of the present disclosure will not be specifically described herein.

Figure 2:
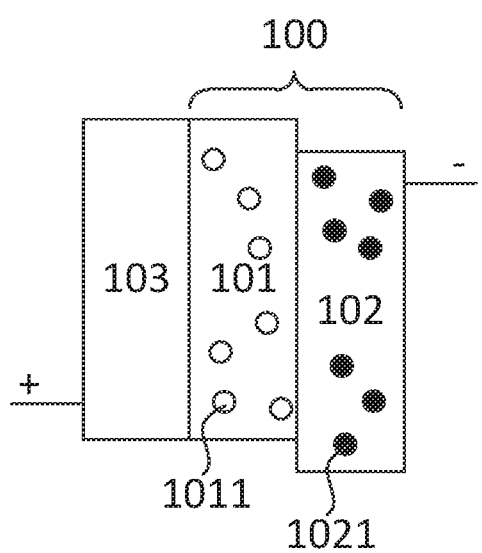
FIG. 2 is a structural schematic diagram of a QLED according to another embodiment of the present disclosure.

As another example, as shown in FIG. 2, the QLED provided by the embodiment of the present disclosure further includes: a hole injection layer formed on one side of the first quantum dot layer.

That is, as shown in FIG. 2, the QLED includes a hole injection layer 103, a first quantum dot layer 101, and a second quantum dot layer 102, which are sequentially stacked.

When applied, holes undergo carrier migration in the first quantum dot layer, and electrons undergo carrier migration in the second quantum dot layer, both of which are recombined into excitons in the first quantum dot layer and/or the second quantum dot layer to emit light, ensuring that the exciton recombination region is confined within the quantum dot layer.

The QLEDs of above-mentioned structure are generally applied to the following case: the light-emitting recombination region is easily to occur at the hole transporting layer, at the junction of the hole transporting layer and the quantum dot layer, at the electron transporting layer or at the junction of the electron transporting layer and the quantum dot layer. The HOMO of the first quantum dot layer has a high degree of matching with the hole injection layer and a good hole transporting property. The first quantum dot layer may simultaneously function as a hole transporting layer and a light emitting layer. The LUMO energy level of the second quantum dot is matched with the cathode, and electron injection is suitable. The second quantum dot layer may simultaneously function as an electron transporting layer and a light emitting layer.

As a further example, the QLED provided by the embodiment of the present disclosure further includes: a hole injection layer formed on a side of the first quantum dot layer, a hole transporting layer formed between the hole injection layer and the first quantum dot layer. Alternatively, the QLED further includes: an electron transporting layer formed on a side of the second quantum dot layer.

Figure 3:
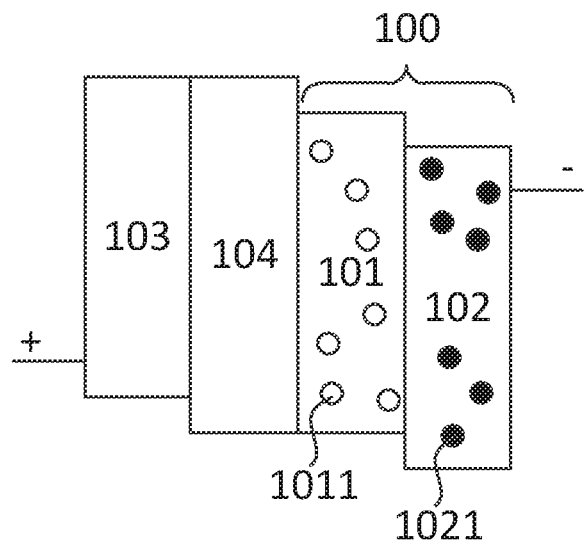
FIG. 3 is a structural schematic diagram of a QLED according to another embodiment of the present disclosure.

That is, as shown in FIG. 3, the QLED includes: a hole injection layer 103, a hole transporting layer 104, a first quantum dot layer 101, and a second quantum dot layer 102, which are sequentially stacked.

When applied, holes undergo carrier migration in the hole transporting layer and the first quantum dot layer, and electrons undergo carrier migration in the second quantum dot layer, both of which are recombined into excitons in the first quantum dot layer and/or the second quantum dot layer to emit light, ensuring that the exciton recombination region is confined within the quantum dot layer.

The QLEDs of above-mentioned structure are generally applied to the following case: the light-emitting recombination region is easily to occur at the hole transporting layer, at the junction of the hole transporting layer and the quantum dot layer, at the electron transporting layer or at the junction of the electron transporting layer and the quantum dot layer. The LUMO energy level of the second quantum dot is matched with the cathode, and electron injection is suitable. The second quantum dot layer may simultaneously function as an electron transporting layer and a light emitting layer.

Figure 4:
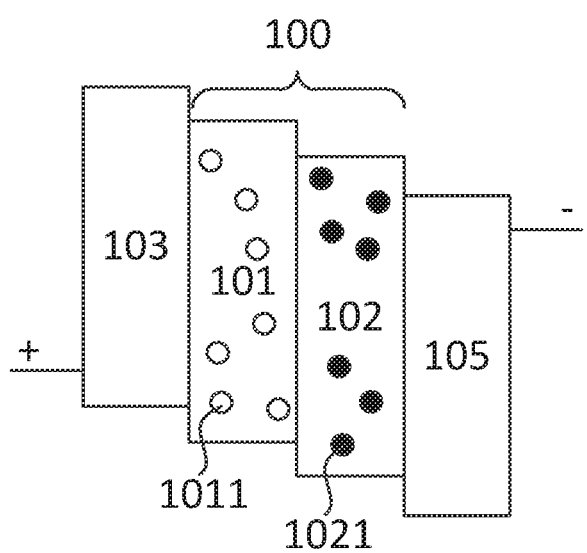
FIG. 4 is a structural schematic diagram of a QLED according to another embodiment of the present disclosure.

Alternatively, as shown in FIG. 4, the QLED includes a hole injection layer 103, a first quantum dot layer 101, a second quantum dot layer 102, and an electron transporting layer 105, which are sequentially stacked.

When applied, holes undergo carrier migration in the first quantum dot layer, and electrons undergo carrier migration in the electron transporting layer and the second quantum dot layer, both of which are recombined into excitons in the first quantum dot layer and/or the second quantum dot layer to emit light, ensuring that the exciton recombination region is confined within the quantum dot layer.

The QLEDs of above-mentioned structure are generally applied to the following case: the HOMO of the first quantum dot layer has a high degree of matching with the hole injection layer and a good hole transporting property. The first quantum dot layer may simultaneously function as a hole transporting layer and a light emitting layer.

Figure 5:
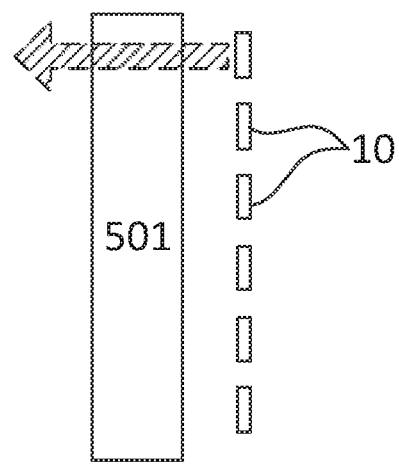
FIG. 5 is a structural schematic diagram of a display device according to an embodiment of the present disclosure.
Figure 6:
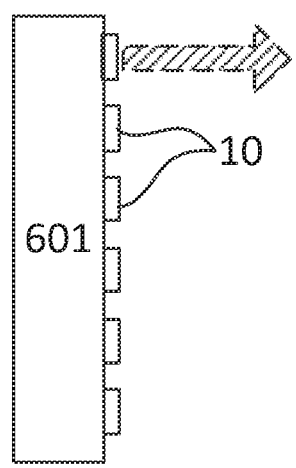
FIG. 6 is a structural schematic diagram of a display device according to another embodiment of the present disclosure.

In another aspect, an embodiment of the present disclosure also provides a display device. As shown in FIGS. 5 and 6, the display device includes any of the QLEDs 10 as described above.

It may be understood that the display device provided by the embodiment of the present disclosure is based on the use of the first quantum dot layer and the second quantum dot layer, and the luminous efficiency is higher and more stable.

In a possible implementation, as shown in FIG. 5, the display device further includes a liquid crystal display panel 501, wherein the light emitting surface of the QLED 10 faces the light incident surface of the liquid crystal display panel 501.

In a possible implementation, the display device further includes an array substrate 601; wherein the QLED is on the array substrate 601.

Embodiments of the present disclosure also provides a method for fabricating a quantum dot light emitting diode. The method including: providing a first quantum dot layer; providing a second quantum dot layer; and stacking the first quantum dot layer and the second quantum dot layer to form a light emitting layer. The first quantum dot layer includes a first quantum dot having a hole transporting property. The second quantum dot layer includes a second quantum dot having an electron transporting property.

In a possible implementation, the step of providing a first quantum dot layer includes: bonding a hole transporting group to a ligand alkyl chain to form the hole transporting ligand; and chemically substituting the hole transporting ligand with a quantum dot which has a surface coordinated with oleic acid, trioctylphosphine or oleylamine ligand to obtain a first quantum dot which has a surface coordinated with a hole transporting ligand.

In a possible implementation, a surface of the first quantum dot is coordinated with a hole transporting ligand. The hole transporting ligand includes: a ligand alkyl chain and a hole transporting group bonded to an alkyl group of the ligand alkyl chain. The ligand in the ligand alkyl chain includes at least one of a mercapto group, a polymercapto group, an amino group, a polyamino group, and a phosphorusoxy group.

In a possible implementation, the step of providing a second quantum dot layer includes: bonding an electron transporting group to a ligand alkyl chain to form an electron transporting ligand; and chemically substituting the electron transporting ligand with a quantum dot which has a surface coordinated with oleic acid, trioctylphosphine or oleylamine ligand to obtain a second quantum dot which has a surface coordinated with an electron transporting ligand.

In a possible implementation, a surface of the second quantum dot is coordinated with an electron transporting ligand. The electron transporting ligand includes: a ligand alkyl chain and an electron transporting group bonded to an alkyl group of the ligand alkyl chain. The ligand in the ligand alkyl chain includes at least one of a mercapto group, a polymercapto group, an amino group, a polyamino group, and a phosphorusoxy group.

In the description of the present specification, the description of the terms "one embodiment", "another embodiment" or the like means that the specific features, structures, materials or characteristics described in connection with the embodiments are included in at least one embodiment of the present disclosure. In the present specification, the schematic representation of the above terms is not necessarily directed to the same embodiment or example. Furthermore, the particular features, structures, materials, or characteristics described may be combined in a suitable manner in any one or more embodiments or examples. In addition, various embodiments or examples described in the specification, as well as features of various embodiments or examples, may be incorporated and combined by those skilled in the art, without contradictory. In addition, it should be noted that in the present specification, the terms "first" and "second" are used for descriptive purposes only, and are not to be construed as indicating or implying a relative importance or implicitly indicating the number of technical features indicated.

The above embodiments are only used for explanations rather than limitations to the present disclosure, the ordinary skilled person in the related technical field, in the case of not departing from the spirit and scope of the present disclosure, may also make various modifications and variations. Therefore, all the equivalent solutions also belong to the scope of the present disclosure, and the patent protection scope of the present disclosure should be defined by the claims.

What is claimed is:

1. A quantum dot light emitting diode comprising:
   a light emitting layer, the light emitting layer comprising a first quantum dot layer and a second quantum dot layer which are stacked;
   wherein the first quantum dot layer comprises a first quantum dot having a hole transporting property;
   wherein the second quantum dot layer comprises a second quantum dot having an electron transporting property; and
   wherein a surface of the first quantum dot is coordinated with a hole transporting ligand;
   the hole transporting ligand comprises: a ligand alkyl chain and a hole transporting group bonded to an alkyl group of the ligand alkyl chain; and
   the ligand in the ligand alkyl chain comprises at least one of a mercapto group, a polymercapto group, and amino group, a polyamino group, and a phosphorusoxy group.

2. The quantum dot light emitting diode according to claim 1, wherein the hole transporting group comprises at least one of triphenylamine, carbazole, and thiophene.

3. The quantum dot light emitting diode according to claim 1, wherein the first quantum dot is prepared by the following method:
   bonding the hole transporting group to a ligand alkyl chain to form the hole transporting ligand; and
   chemically substituting the hole transporting ligand with a quantum dot which has a surface coordinated with oleic acid, trioctylphosphine or oleylamine ligand, to obtain the first quantum dot which has the surface coordinated with the hole transporting ligand.

4. The quantum dot light emitting diode according to claim 1, wherein the first quantum dot is oil-soluble, and the second quantum dot is water-soluble;
   alternatively, the first quantum dot is water-soluble, and the second quantum dot is oil-soluble.

5. The quantum dot light emitting diode according to claim 1, wherein one of the first quantum dot and the second quantum dot comprises a crosslinked structure.

6. The quantum dot light emitting diode according to claim 1, further comprising: a hole transporting layer and a hole injection layer on a side of the first quantum dot layer facing away from the second quantum dot layer; and
   an electron transporting layer on a side of the second quantum dot layer facing away from the first quantum dot layer.

7. The quantum dot light emitting diode according to claim 1, further comprising: a hole injecting layer on a side of the first quantum dot layer facing away from the second quantum dot layer.

8. The quantum dot light emitting diode according to claim 7, further comprising one of: a hole transporting layer between the hole injection layer and the first quantum dot layer; and
   an electron transporting layer formed on a side of the second quantum dot layer facing away from the first quantum dot layer.

9. A display device comprising the quantum dot light emitting diode according to claim 1.

10. The display device according to claim 9, further comprising: a liquid crystal display panel; wherein a light emitting surface of the quantum dot light emitting diode faces a light incident surface of the liquid crystal display panel.

11. The display device according to claim 9, further comprising: an array substrate; wherein the quantum dot light emitting diode is on the array substrate.

12. A method for fabricating a quantum dot light emitting diode, comprising:
    providing a first quantum dot layer;
    providing a second quantum dot layer; and
    stacking the first quantum dot layer and the second quantum dot layer to form a light emitting layer;
    wherein the first quantum dot layer comprising a first quantum dot having a hole transporting property;
    the second quantum dot layer comprising a second quantum dot having an electron transporting property; and
    wherein a surface of the first quantum dot is coordinated with a hole transporting ligand;
    the hole transporting ligand comprises: a ligand alkyl chain and a hole transporting group bonded to an alkyl group of the ligand alkyl chain;
    the ligand in the ligand alkyl chain comprises at least one of the mercapto group, a polymercapto group, and amino group, a polyamino group, and a phosphorusoxy group.

13. The method according to claim 12, wherein providing the first quantum dot layer comprises:
    bonding a hole transporting group to a ligand alkyl chain to form a hole transporting ligand; and chemically substituting the hole transporting ligand with a quantum dot which has a surface coordinated with oleic acid, trioctylphosphine or oleylamine ligand to obtain a first quantum dot which has a surface coordinated with a hole transporting ligand.

14. The method according to claim 12, wherein providing the second quantum dot layer comprises:
    bonding an electron transporting group to a ligand alkyl chain to form an electron transporting ligand; and chemically substituting the electron transporting ligand with a quantum dot which has a surface coordinated with oleic acid, trioctylphosphine or oleylamine ligand to obtain a second quantum dot which has a surface coordinated with an electron transporting ligand.

15. The method according to claim 12, wherein a surface of the second quantum dot is coordinated with an electron transporting ligand;
    the electron transporting ligand comprises: a ligand alkyl chain and an electron transporting group bonded to an alkyl group of the ligand alkyl chain;
    the ligand in the ligand alkyl chain comprises at least one of a mercapto group, a polymercapto group, an amino group, a polyamino group, and a phosphorusoxy group.

16. A quantum dot light emitting diode comprising:
    a light emitting layer, the light emitting layer comprising a first quantum dot layer and a second quantum dot layer which are stacked;

wherein the first quantum dot layer comprises a first quantum dot having a hole transporting property;

wherein the second quantum dot layer comprises a second quantum dot having an electron transporting property; and wherein a surface of the second quantum dot is coordinated with an electron transporting ligand;

the electron transporting ligand comprises: a ligand alkyl chain and an electron transporting group bonded to an alkyl group of the ligand alkyl chain; and the ligand in the ligand alkyl chain comprises at least one of a mercapto group, a polymercapto group, an amino group, a polyamino group, and a phosphorusoxy group.

17. The quantum dot light emitting diode according to claim 16, wherein the electron transporting group comprises at least one of a pyridine, a diazine, a cyano group, and a boron-containing aromatic group.

18. The quantum dot light emitting diode according to claim 16, wherein the second quantum dot is prepared by the following method:

bonding the electron transporting group to a ligand alkyl chain to form the electron transporting ligand; and chemically substituting the electron transporting ligand with a quantum dot which has a surface coordinated with oleic acid, trioctylphosphine or oleylamine ligand, to obtain the second quantum dot which has the surface coordinated with the electron transporting ligand.

\* \* \* \* \*